(12) United States Patent
Hash et al.

(10) Patent No.: US 7,385,144 B2
(45) Date of Patent: Jun. 10, 2008

(54) METHOD AND APPARATUS FOR ELECTRICALLY CONNECTING PRINTED CIRCUIT BOARDS OR OTHER PANELS

(75) Inventors: Ronald J. Hash, Palm Bay, FL (US); Mitchell Percival, Melboure, FL (US)

(73) Assignee: Harris Corporation, Melbourne, FL (US)

( * ) Notice: Subject to any disclaimer, the term of this patent is extended or adjusted under 35 U.S.C. 154(b) by 215 days.

(21) Appl. No.: 11/281,797

(22) Filed: Nov. 17, 2005

(65) Prior Publication Data

US 2007/0107935 A1    May 17, 2007

(51) Int. Cl.
*H05K 1/03*    (2006.01)
*H05K 3/10*    (2006.01)

(52) U.S. Cl. .................. 174/255; 174/262; 29/852; 29/417

(58) Field of Classification Search ............... 174/255, 174/262; 29/417, 830, 852
See application file for complete search history.

(56) References Cited

U.S. PATENT DOCUMENTS

| | | | |
|---|---|---|---|
| 6,005,766 A | * | 12/1999 | Muraki .................. 361/679 |
| 6,021,048 A | * | 2/2000 | Smith .................... 361/736 |
| 6,472,744 B1 | * | 10/2002 | Sato et al. ............. 257/723 |
| 6,487,086 B2 | * | 11/2002 | Ikeda ..................... 361/772 |
| 6,534,726 B1 | * | 3/2003 | Okada et al. .......... 174/263 |
| 7,189,083 B2 | * | 3/2007 | Seidler et al. ........... 439/83 |
| 2004/0233024 A1 | * | 11/2004 | Almeida et al. ........ 333/246 |
| 2006/0042831 A1 | * | 3/2006 | Rohde et al. .......... 174/262 |

* cited by examiner

*Primary Examiner*—Ishwar I. B. Patel
(74) *Attorney, Agent, or Firm*—GrayRobinson, PA

(57) ABSTRACT

A method and apparatus is provided for forming a printed circuit board or other panel in which an array of vias are arranged in a desired connection grid within one or more layers of the board and then the board and vias are cut to form an edge of the board where a surface of the vias is exposed. The board may be orthogonally mounted on its edge to another thin circuit board or aperture sheet with the exposed surface of each via directly connected to such other board or sheet.

4 Claims, 2 Drawing Sheets

US 7,385,144 B2

METHOD AND APPARATUS FOR ELECTRICALLY CONNECTING PRINTED CIRCUIT BOARDS OR OTHER PANELS

FIELD OF THE INVENTION

This invention is directed to a method and apparatus for electrically connecting printed circuit boards or other panels to one another, and, more particularly, to a method and apparatus for electrically connecting one printed circuit board or panel directly and perpendicularly to another printed circuit board or panel wherein the board is produced with an edge having a desired connection grid of exposed, electrically conductive vias.

BACKGROUND OF THE INVENTION

Many applications require the orthogonal, electrical connection of one printed circuit board to other thin circuit boards or aperture sheets suitable for microwave frequencies. Although a number of techniques have been employed in the past for connecting boards together, space considerations, cost and other factors present problems with their use. For example, one common type of connection for mounting two boards perpendicularly to one another involves the use of pin arrays and sockets. One of the boards carries a number of spaced pins and the second board mounts a socket which receives the pins when the two boards are connected together. SMT radio frequency connectors systems are generally similar in construction. Both of these connector systems are relatively large and expensive, and cannot be readily made to the tolerance requirements of many applications.

Flexible or "flex" circuits provide another option of mounting boards perpendicular to one another. Flex circuits are used in a wide variety of applications where an electrical circuit must bend around corners or be flexed during operation. In order to mount two boards perpendicularly to one another, a hard bend must be made in the flex circuit which is subject to fatigue at certain temperature cycles. Flex circuit are also difficult to assemble in many instances, especially in applications with very limited spacing between boards or other components.

SUMMARY OF THE INVENTION

This invention is directed to a method and apparatus for orthogonally connecting a printed circuit board to other thin circuit boards or aperture sheets in which a board is produced having an edge with a desired connection grid of exposed, electrically conductive vias.

In the presently preferred embodiment, a panel having one or more layers is provided with an array of vias arranged in a desired connection grid. Each layer is formed with a number of holes, which may be through bores or blind bores, and these holes are plated to form vias in the conventional manner. Preferably all, but at least some, of the vias in each layer are filled with an electrically conductive material. The several layers are then laminated to one another to form the panel, with the vias in such layers collectively forming the connection grid. The panel, and each of the vias, is cut in a direction substantially perpendicular to the longitudinal axes of the vias to form an edge of the panel where a surface of each of the vias is exposed. The exposed surface of the vias, which preferably have been cut in half, is plated with an electrically conductive material. The cut edge of this panel, with the array of vias exposed on its surface, may then be perpendicularly connected to another thin circuit board, an aperture sheet or other panel by a ribbon bonder, a wire bonder, a welder or other suitable means.

The panel may be formed of essentially any number of layers, and the connection grid of vias may be arranged as desired within the layers. The method and resulting panel of this invention allows for very small and dense connections between such panel and the board, aperture plate or other panel to which it is mounted. No pins or connectors are required. The cut edge of the panel may be directly connected to another board, plate or panel using automated bonding or welding systems since the area presented by the exposed surface of the vias is large in comparison to the contacts that result from the plating of conventional vias for printed circuit boards. In fact, because the vias are cut in half, their exposed surface on the edge of the panel is substantially equal to the diameter of the holes formed in the panel. The direct connection of the vias at the edge of the board with another board or plate also allows for controlled impedance for RF.

BRIEF DESCRIPTION OF THE DRAWINGS

The structure, operation and advantages of the presently preferred embodiment of this invention will become further apparent upon consideration of the following description, taken in conjunction with the accompanying drawings, wherein.

DETAILED DESCRIPTION OF THE INVENTION

Figure 1:
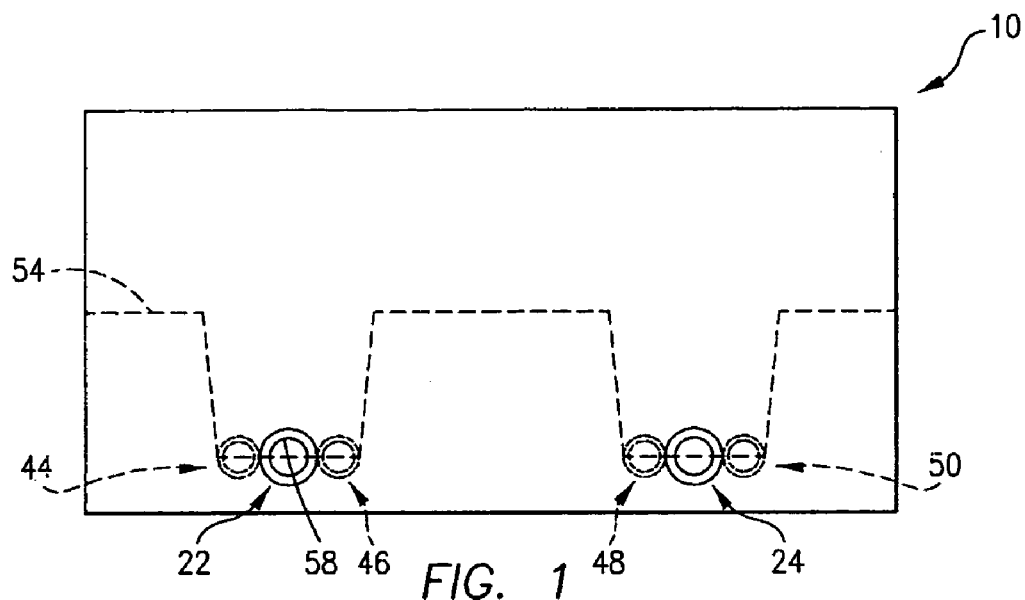
FIG. 1 is a plan view of a three-layer printed circuit board depicting a pattern of vias in the layers.
Figure 2:
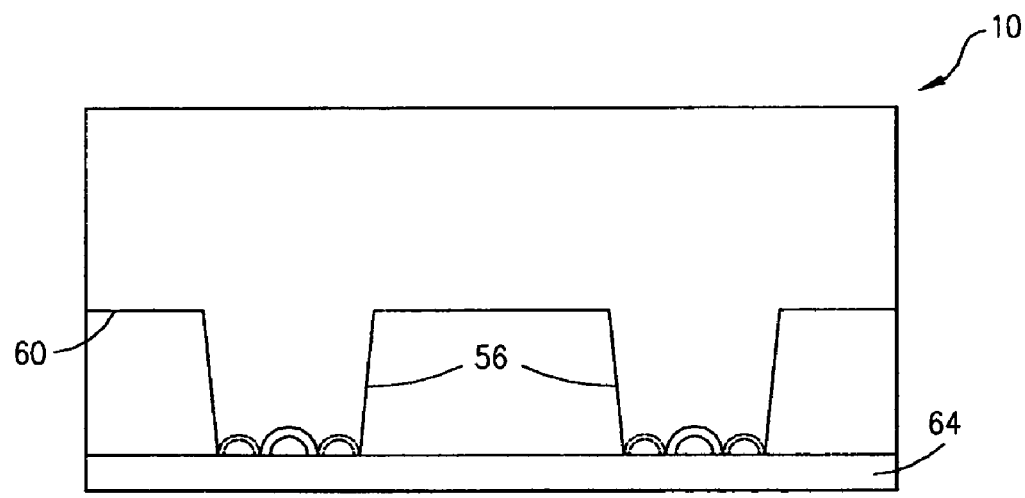
FIG. 2 is a view similar to FIG. 1 except with the board and vias cut along the dotted line shown in FIG. 1, and a second panel or board schematically depicted in a position mounted to such board.
Figure 3:
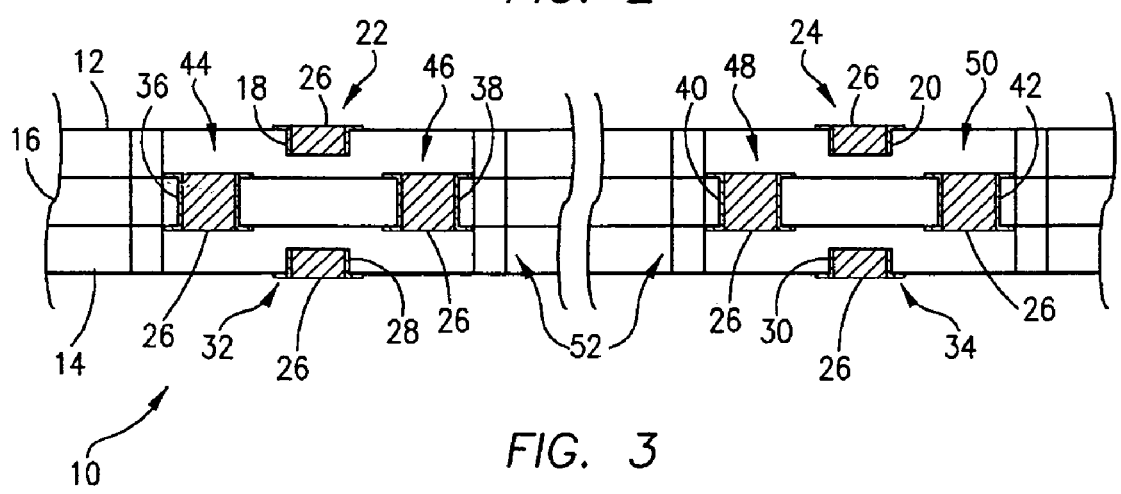
FIG. 3 is an enlarged, partial end view of the cut edge of the board illustrated in FIGS. 1 and 2.
Figure 4:
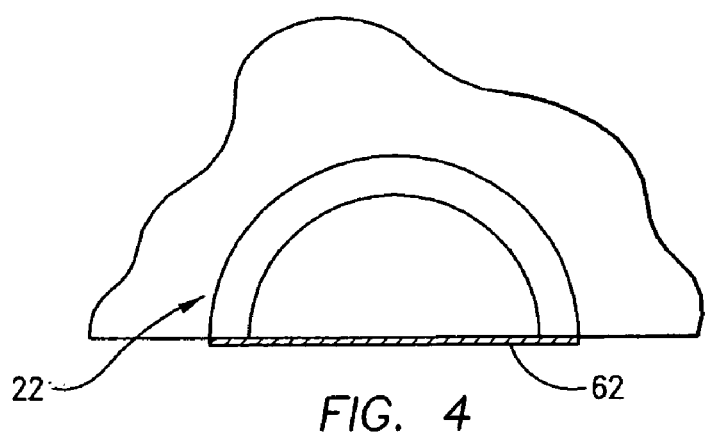
FIG. 4 is an enlarged, plan view of one of the vias shown in FIGS. 1-3 depicting the plating provided on the exposed surface of the vias.

Referring initially to FIGS. 1-4, a panel 10 is shown having a top layer 12, a bottom layer 14 and a middle layer 16 sandwiched between the top and bottom layers 12, 14. The term "panel" is used herein to broadly refer to a printed circuit board, an aperture sheet and essentially any other thin circuit board which may mount electrical components (not shown) or other components. Additionally, the terms "top" and "bottom" are intended to denote the vertical orientation of the panel 10 as it is depicted in FIG. 3 of the drawings, and each of the layers 12-16 has a top surface and a spaced, parallel bottom surface in such orientation of the panel 10. The panel 10 is fabricated using a standard sequential lamination process with blind and buried vias as is common in the printed wiring board industry. As discussed below, an array of vias are formed in the layers 12-16 in a desired connection grid. It should be understood that the particular connection grid shown in the Figs. is for purposes of illustration only, and may be varied as desired.

As best seen in FIG. 3, two blind bores 18 and 20 are drilled in the top layer 12 and their walls are plated with a conductive material in a conventional manner to form vias 22 and 24, respectively. Each of the bores 18 and 20 is filled with a conductive material 26, which is flush with the top surface of the top layer 12. Similarly, the bottom layer 14 is formed with two blind bores 28 and 30 which are plated to form vias 32 and 34, respectively. The vias 32 and 34 are filled with the conductive material 26, which is flush with the bottom surface of the bottom layer 14. The middle layer 16 is formed with four through bores 36, 38, 40 and 42, each of which is plated to form identical vias 44, 46, 48 and 50, respectively. Each of the vias 44-50 is filled with the conductive material 26, flush with both the top and bottom surfaces of the middle layer 16. The vias 22 and 24 of the top layer 12, the vias 32 and 34 of the bottom layer 14 and the vias 44-50 of the middle layer 16 are collectively arranged to form a connection grid 52 within the panel 10. The connection grid 52 is only one of many possible arrangements of the vias in a three-layer panel construction, and is shown for purposes of illustration only.

After the layers 12, 14 and 16 are fabricated in the manner described above to form the panel 10, a cutting operation is performed using any suitable means. In FIG. 1, a dotted line 54 is shown to depict where the panel 10 is to be cut for a particular application in which extensions 56 are required for connection to another board or aperture sheet (not shown). FIG. 2 illustrates the panel 10 after the cutting operation is completed and the extensions 56 are formed. As seen in FIGS. 1 and 2, the cutting operation proceeds in a direction substantially perpendicular to the plane of the panel 10, e.g. into the sheet in which the drawings appear. Additionally, the cut is made through the center of each of the vias 22, 24, 30, 32 and 44-50, substantially perpendicular to the longitudinal axes thereof. The longitudinal axis 58 of via 22 is shown by an "X" in FIG. 1 by way of example. In this manner, a surface of each of the vias 22, 24, 30, 32 and 44-50 is exposed on the cut or end edge 60 of the panel 10 as seen in FIG. 3. Preferably, such exposed surfaces are coated with a plating material 62 such as gold, nickel cadmium or other suitable electrically conductive plating material. See FIG. 4. The edge 60 of the panel 10, in turn, can be mounted perpendicularly to a second panel 64 as schematically shown in FIG. 2, by any suitable means including an automated ribbon bonder, a wire bonder, solder or a welder. The exposed surfaces of the vias 22, 24, 32, 34 and 44-50 present a relatively large area for connection to electrical components. Additionally, a number of discrete connections, one for each of the vias 22, 24, 32, 34 and 44-50, is provided in a densely packed, relatively small area defined by the edge 60 of the panel 10.

Figure 5:
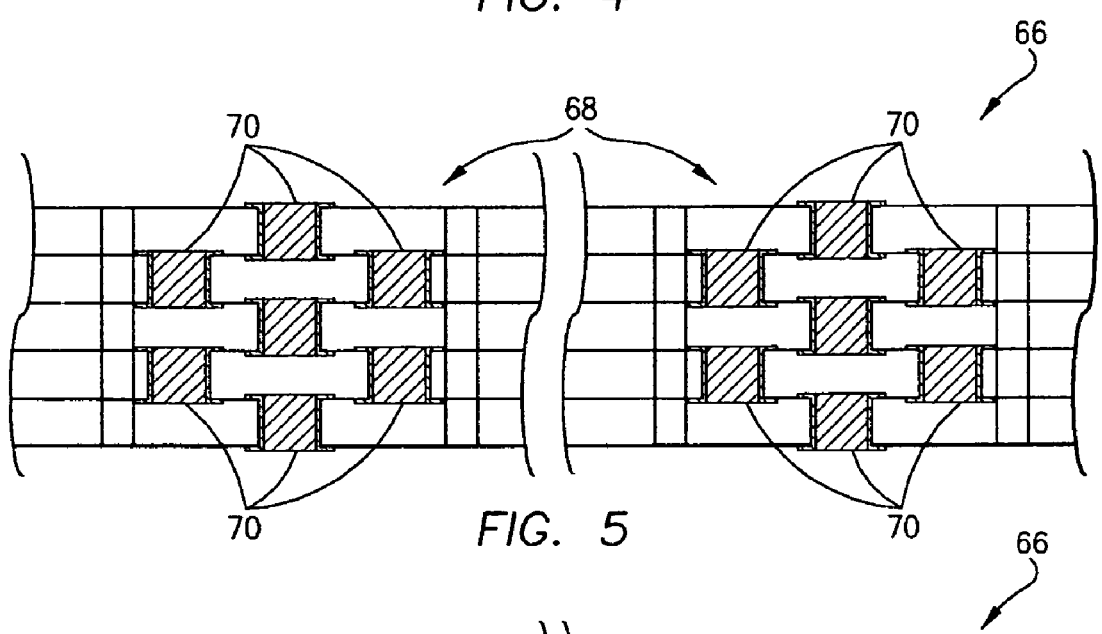
FIG. 5 is an enlarged, end view of the cut edge of a five-layer printed circuit board according to this invention with one possible pattern of vias.
Figure 6:
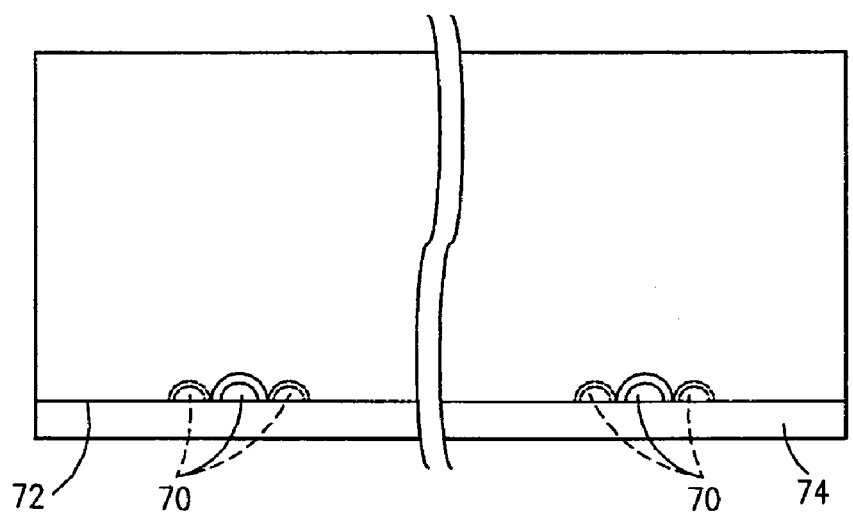
FIG. 6 is a plan view of the board shown in FIG. 5, which is shown connected to a second board or panel.

It should be understood that panels having essentially any number of layers, with different connection grids as desired, are considered to be within the scope of this invention. Referring to FIGS. 5 and 6, a portion of a five layer panel 66 is shown having a connection grid 68 with a total of fourteen vias 70. All of the vias 70 are identical to one another in this embodiment, although they need not be, and each layer of the panel 66 is fabricated in the same manner as described in connection with a discussion of FIGS. 1-4 to form the vias 70. The panel 66 is cut to form an edge 72, as described above, except that the edge 72 is straight in this embodiment instead of being formed with extensions as in FIG. 2. When the panel 66 is cut, each via 70 is split in half and exposed on the panel edge 72. See FIG. 5. Such exposed surfaces of the vias 70 are plated in the same manner as described above and shown in FIG. 4. The panel 66 may then be mounted perpendicularly to a second panel 74, as schematically illustrated in FIG. 6.

While the invention has been described with reference to a preferred embodiment, it should be understood by those skilled in the art that various changes may be made and equivalents substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of electrically connecting two panels, comprising:
   (a) providing a first panel with a first surface spaced from a second surface;
   (b) forming an array of holes in said first panel extending from one of said first and second surfaces toward the other, each of said holes defining a wall within said first panel;
   (c) applying a plating to said wall of each of said holes to form vias;
   (d) filling each of said vias with an electrically conductive material;
   (e) thereafter cutting said first panel including said vias in a direction from said first surface toward said second surface to form a cut edge of said first panel, a portion of said plating along said wall of said vias and a portion of said conductive material within each of said vias being exposed by and extending substantially flush with said cut edge;
   (f) applying an electrically conductive plating to said portion of electrically conductive material within each of said vias that is exposed and is substantially flush with said cut edge; and
   (g) affixing said cut edge of said first panel to a second panel.

2. The method of claim 1 in which step (a) comprises providing said first panel with at least one first layer and at least one second layer, said method further including performing each of steps (b), (c), and (d) on each of said at least one first layer and said at least one second layer, connecting said at least one first layer to said at least one second layer and thereafter performing steps (e) and (f) on said combined at least one first and second layers.

3. A panel, comprising:
   at least one layer having a first surface spaced from a second surface, a number of holes formed in said at least one layer each defining a wall;
   a plating material applied to said wall of each of said holes to form vias;
   an electrically conductive material filling at least some of said vias;
   said at least one layer being cut in a direction from said first surface to said second surface to form a cut edge, a portion of said plating material along said wall of at least some of said vias and a portion of said conductive material within at least some of said vias being exposed by and extending substantially flush with said cut edge; and an electrically conductive plating applied to said portion of said conductive material within said at least some of said vias that is exposed by and substantially flush with said cut edge.

4. The panel of claim 3 in which said cut edge of said at least one layer is adapted to mount perpendicularly to another panel so that said portion of said plating material along said wall of at least some of said vias and said portion of said conductive material within said at least some of said vias directly contacts the other panel.

* * * * *